(12) United States Patent
Cartier

(10) Patent No.: US 6,717,398 B2
(45) Date of Patent: Apr. 6, 2004

(54) SIGNAL LAUNCH CONNECTING TECHNIQUES

(75) Inventor: Marc Cartier, Rochester, NH (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/200,788

(22) Filed: Jul. 22, 2002

(65) Prior Publication Data

US 2002/0180471 A1 Dec. 5, 2002

Related U.S. Application Data

(62) Division of application No. 09/692,916, filed on Oct. 20, 2000, now Pat. No. 6,452,379.

(51) Int. Cl.[7] ............................................. G01R 31/02
(52) U.S. Cl. ..................................... 324/158.1; 324/95
(58) Field of Search ........................ 324/158.1, 73.1, 324/754, 761, 95; 439/482, 91, 620, 63; 174/78

(56) References Cited

U.S. PATENT DOCUMENTS 4,012,095 A * 3/1977 Doucet et al. ............... 439/63
5,219,305 A * 6/1993 Kawaguchi et al. ......... 439/620
5,315,063 A * 5/1994 Auclair ......................... 174/78
5,832,372 A 11/1998 Clelland et al. ............. 455/115
6,281,690 B1 8/2001 Frey ............................ 324/754

OTHER PUBLICATIONS http://www.tek.com/Measurement/Products/catalog/Accessories/probes/accessories/4mm/p6150/graphics/280ill98–full.w.gif, (No title), Tektronix, Inc., Beaverton, Oregon, Aug. 28, 2000.

* cited by examiner

Primary Examiner—Vinh P. Nguyen
(74) Attorney, Agent, or Firm—David E. Huang, Esq.

(57) ABSTRACT

A technique provides a radio frequency probe. The technique involves obtaining a surface mount connector having a flat-faced side that includes (i) a central region, (ii) a conductive outer region that extends along a periphery of the flat-faced side, and (iii) a conductive intermediate region disposed between the central region and the conductive outer region. The conductive outer region and the conductive intermediate region are electrically connected with each other. The technique further involves forming a cavity within the surface mount connector through the conductive intermediate region of the flat-faced side of the surface mount connector, and installing an end of a ground post within the cavity formed within the surface mount connector.

18 Claims, 5 Drawing Sheets

SIGNAL LAUNCH CONNECTING TECHNIQUES

CROSS REFERENCE TO RELATED APPLICATIONS

This Application is a Divisional of U.S. application Ser. No. 09/692,916, filed Oct. 20, 2000 now U.S. Pat. No. 6,452,379 and entitled "Methods and Apparatus for Connecting to a Signal Launch," the teachings of which are hereby incorporated by reference herein in their entirety.

BACKGROUND OF THE INVENTION

In general, a thorough test of a high-speed digital system includes a procedure for sampling signals from hardware components of the system (e.g., circuit boards, interconnects, silicon devices, etc.) in order to determine how these components affect signal integrity. To access these signals, an engineer or technician typically connects specialized measurement equipment to the system hardware. In some configurations, such equipment includes a measuring device (e.g., a Time Domain Reflectometer or TDR) that connects to a circuit board which is either (i) part of the high-speed digital system under test, or (ii) a specialized assembly (e.g., a daughter card) that closely integrates with the system under test (e.g., through high-density connectors). Typically, the engineer permanently mounts a coaxial radio frequency (RF) connector to a specialized feature of the circuit board called a signal launch. The engineer can then attach a coaxial cable (e.g., a 50 ohm cable) from the measuring device to the soldered RF connector in order to access signals of the system under test.

One type of permanent mount RF connector, which is hereinafter referred to as an edge mount connector, has soldering posts that attach to an edge mount signal launch along an edge of a special type of circuit board called a microstrip, or microstrip line, which has an exposed signal conductor on one side of a dielectric substrate and an exposed ground conductor on the other side. Both the signal and ground conductors typically run to the edge of the circuit board to form the edge mount signal launch. An engineer typically solders an inner soldering post of the edge mount connector to the signal conductor and solders outer soldering posts to the ground conductor. The engineer can then access signals of the system under test by attaching a coaxial cable from a measuring device to the edge mount connector.

Another type of permanent mount RF connector, which is hereinafter referred to as a posted surface mount connector, has soldering posts that attach to a surface mount signal launch residing on the surface of a circuit board (rather than along an edge) in order to mount to the circuit board perpendicularly relative to the circuit board surface. The soldering posts of the posted surface mount connector are used in a manner similar to the soldering posts of the above-described edge mount connector. That is, an engineer typically solders an inner soldering post of the connector to a signal conductor of the surface mount signal launch and solders outer soldering posts to a ground conductor. The engineer can then access signals of the system under test by attaching a coaxial cable from a measuring device to the posted surface mount connector.

Another type of permanent mount RF connector, which is hereinafter referred to as a flat-faced surface mount connector, has a flat-faced base portion that sits flush on a surface mount signal launch. The flat-faced base portion does not include any protrusions (e.g., soldering posts, tabs, etc.). Rather, the base portion includes (i) a recessed, cylindrically-shaped signal conductor that receives a signal pin of the surface mount signal launch, and (ii) a ground conductor that defines mounting holes. To mount the flat-faced surface mount connector to the signal launch, an engineer typically inserts the signal pin of the signal launch into the signal conductor of the connector base portion, and aligns the mounting holes defined by the ground conductor with matching ground vias of the signal launch. The engineer then inserts screws through (i) the mounting holes of the connector and (ii) the matching ground vias of the signal launch, and fastens nuts on the ends of the screws to hold the connector firmly against the signal launch. The engineer can then attach a coaxial cable from the flat-faced surface mount connector to the measuring device in order to access signals of the system under test using the measuring device.

Most circuit boards, which are configured with a permanently mounted RF connector for external high-speed signal access, have multiple permanently mounted RF connectors to enable an engineers to access many different signals. When the engineers wants to sample a particular signal, the engineers attaches a cable from the measuring equipment to one of the permanently mounted RF connectors. If the engineer wishes to sample a different signal the engineers can detach the cable from that permanently mounted RF connector and attach the cable to another permanently mounted RF connector.

Some measurement equipment does not connect to circuit boards through permanent mount RF connectors. Such equipment typically includes a measuring device, an RF probe and a cable that connects the RF probe to the measuring device. The RF probe alleviates the need for an engineer to permanently mount RF connectors to signal launches of a circuit board. Rather, the engineer simply can temporarily attach the RF probe directly to the signal launch in order to access signals from the circuit board.

One type of RF probe has an elongated shape with a cable connecting portion at one end, and a pointed signal pin at the other end. Near the pointed signal pin is a cylindrical ground conductor. Typically, an engineer attaches a metallic ground extension to the cylindrical ground conductor, and moves the RF probe (i.e., manually manipulates the RF probe) such that (i) the signal pin of the RF probe contacts the signal conductor (e.g., a signal via) of the signal launch, and (ii) the metallic ground extension contacts the ground conductor (e.g., a ground via) of the signal launch. An example of a similar type of RF probe is that manufactured by Tektronix of Beaverton, Oreg.

One type of metallic ground extension has a cuff that fits over the cylindrical ground conductor of the RF probe, and a ground pin that extends from the cuff in the same direction as the signal pin. Another type of metallic ground extension includes a multi-pronged cuff that fits over the cylindrical ground conductor of the RF probe such that multiple prongs of that cuff extend in the same direction as the signal pin. Yet another type of metallic ground extension includes a spring that fits around the cylindrical ground conductor of the RF probe such that a wire end of the spring extends in the same direction as the signal pin. Accordingly, a portion of each type of metallic ground extension can engage a ground via of the signal launch (e.g., the ground via that normally receives a screw to permanently mount an RF connector) as the signal pin engages a signal via of the signal launch.

SUMMARY OF THE INVENTION

Unfortunately, there are deficiencies to the above-described conventional approaches to connecting to signal launches of circuit boards. For example, in connection with conventional permanent mount RF connectors, such connectors are typically expensive. Although an engineer typically connects a measuring device to only one or two permanent mount RF connectors on a circuit board at any given time, a circuit board with signal launches typically includes many permanent mount RF connectors for convenience. As such, in order to sample a different signal of the circuit board, the engineer can simply unscrew a coaxial cable from one connector and screw it onto another connector. Moreover, since such connectors are permanently mounted (e.g., soldered or screwed onto the circuit board), it would be a significant burden to require the engineer to unfasten (e.g., unsolder or unscrew) a conventional permanently mounted RF connector from one signal launch of the circuit board and refasten (e.g., solder or screw) that connector to another signal launch each time the engineer samples a different circuit board signal. Accordingly, the use of many expensive RF connectors results in a high cost for sampling signals.

Additionally, some conventional permanent mount RF connectors are not very well impedance-matched with signal launches. For example, in connection with posted surface mount connectors, there are typically large distances between the signal post and the ground posts which form large inductance loops that lower the signal integrity of high-speed signals.

Similarly, some conventional RF probes are not well impedance-matched with signal launches. That is, the conventional RF probe may be well-matched from the measuring device through the cable to the RF probe, but not well-matched with the signal launch. For example, the above-described elongated RF probe can be connected to a signal launch having a central signal launch, an outer set of ground vias which are used as mounting holes (e.g., for solder or screws), and an inner set of ground vias disposed between the central signal launch and the outer set of ground vias. The cuffed or springed ground extensions typically are sized to engage one or more of the outer set of ground vias. Accordingly, the large distances between the pointed signal pin and the connecting portions of the ground extensions of the RF probe form large inductance loops that provide signal distortion. Although the springed ground extension is somewhat flexible, connecting the springed ground extension to one of the inner ground vias while the pointed signal pin of the RF probe engages the signal via of the signal launch requires awkward manipulation of the ground extension (e.g., twisting, bending, extreme stressing, etc.) that can permanently deform or damage the RF probe.

One may consider using some conventional permanent mount RF connectors as probes for forming temporary connections with circuit board signal launches. For example, an edge mount connector with posts could be used to connect with an edge mount signal launch without being permanently fastened to the signal launch (e.g., without being soldered). Unfortunately, the conventional edge mount connector alone would have a tendency to slide around if not somehow fastened to the circuit board. As another example, a conventional posted surface mount connector could be used to connect with a surface mount signal launch without being permanently soldered to the signal launch (e.g., without being soldered). Unfortunately, as described above, the conventional surface mount signal launch forms large inductance loops with the signal launch thus degrading signal integrity. As yet another example, a conventional flat-faced surface mount connector could be used to connect with a surface mount signal launch without being permanently fastened to the signal launch (e.g., without being screwed to the signal launch). Unfortunately, the conventional flat-faced connector alone has a tendency to slide around the signal launch if not screwed to the signal launch since the flat-faced connector sits flush on the signal launch and does not have any protrusions that insert into the signal launch for stability.

In contrast to the above-described conventional permanent mount RF connectors and the above-described conventional RF probe, the invention is directed to techniques for connecting to a signal launch using an RF probe having a flat-faced side with a ground post extending from a non-peripheral region (e.g., an intermediate region between a central region and a peripheral region of the flat-faced side). The use of such a probe alleviates the need to use many RF connectors permanently mounted to signal launches on a circuit board, and thus reduce costs, since the probe of the invention can be temporarily connected to the signal launches without such permanently mounted connectors. Furthermore, the ground post of the invention probe can be configured to avoid large inductance loops thus preserving signal integrity particularly when sampling high-speed signals.

One arrangement of the invention is directed to an RF probe for connecting to a signal launch. The RF probe includes a cabling portion for coupling to a cable, and a base portion attached to the cabling portion. The base portion has a flat-faced side that faces the signal launch when the RF probe connects to the signal launch. The flat-faced side has (i) a central region, (ii) an outer region that extends along a periphery of the flat-faced side, and (iii) an intermediate region disposed between the central region and the outer region. The RF probe further includes a signal post for connecting to a signal conductor of the signal launch and a ground post for connecting to a ground conductor of the signal launch, when the radio frequency probe connects to the signal launch. The signal post extends from the central region of the flat-faced side of the base portion. The ground post extends from the intermediate region of the flat-faced side of the base portion. The distance between the signal and ground posts can be made to form inductance loops which are smaller than those created by the above-described conventional approaches, and thus minimize signal distortion.

The signal and ground posts enable a user to hold the RF probe in place relative to the signal launch. In particular, the user can press the RF probe against the signal launch such that interference between the posts and vias of the signal launch prevents the RF probe from sliding around.

In one arrangement, the ground post is disposed in a fixed position on the flat-faced side of the base portion. In this arrangement, the base portion of the RF probe includes a ground conductor, and the ground post preferably connects to the ground conductor of the base portion at a solder joint.

In one arrangement, the base portion includes a ground conductor that defines mounting holes. In this arrangement, the ground post preferably extends from a location of the intermediate region that is between the signal post and one of the mounting holes. Accordingly, a flat-faced permanent mount RF connector (e.g., the earlier described conventional surface mount RF connector with mounting holes) can be used as the cabling and base portions of the probe.

In one arrangement, the RF probe has multiple ground posts. That is, in addition to the ground post, the RF probe includes another ground post for connecting to another ground conductor of the signal launch when the radio frequency probe connects to the signal launch. The other ground post extends from the intermediate region of the flat-faced side of the base portion. This arrangement provides multiple pathways for a return ground signal for more uniform current distribution.

In another arrangement, the RF probe has only one ground post. That is, the ground post of the RF probe is a single exclusive ground post. This arrangement limits the amount of conductive material in the RF probe thus providing less conductive material for less capacitance. Furthermore, this arrangement is simpler to make than the arrangement with multiple ground posts (e.g., less soldering of ground posts to the base portion).

In one arrangement, the base portion includes a ground conductor that electrically connects with the ground post. Preferably, the RF probe further includes an insulator that covers at least part of the ground conductor of the base portion. Accordingly, a user can easily hold and move the RF probe without inadvertently touching the ground conductor. In particular, the user can easily maneuver and manipulate the RF probe (e.g., move the RF probe among multiple signal launches).

The features of the invention, as described above, may be employed in testing systems, devices and methods and other computer-related assemblies such as those of Teradyne Corporation of Boston, Mass.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques for connecting to a signal launch using a radio frequency (RF) probe having a flat-faced side with a ground post extending from a non-peripheral region (e.g., an intermediate region between a central region and a peripheral region of the flat-faced side). The use of such a probe alleviates the need to use many RF connectors permanently mounted to signal launches on a circuit board (and thus reduces cost) since the probe of the invention can be temporarily connected to the signal launches without such connectors. Furthermore, the ground post of the invention probe can be configured to avoid large inductance loops thus preserving signal integrity.

The techniques of the invention may be used for testing high-speed digital system, and in other computer-related systems and methods, such as those of Teradyne Corporation of Boston, Mass.

Figure 1:
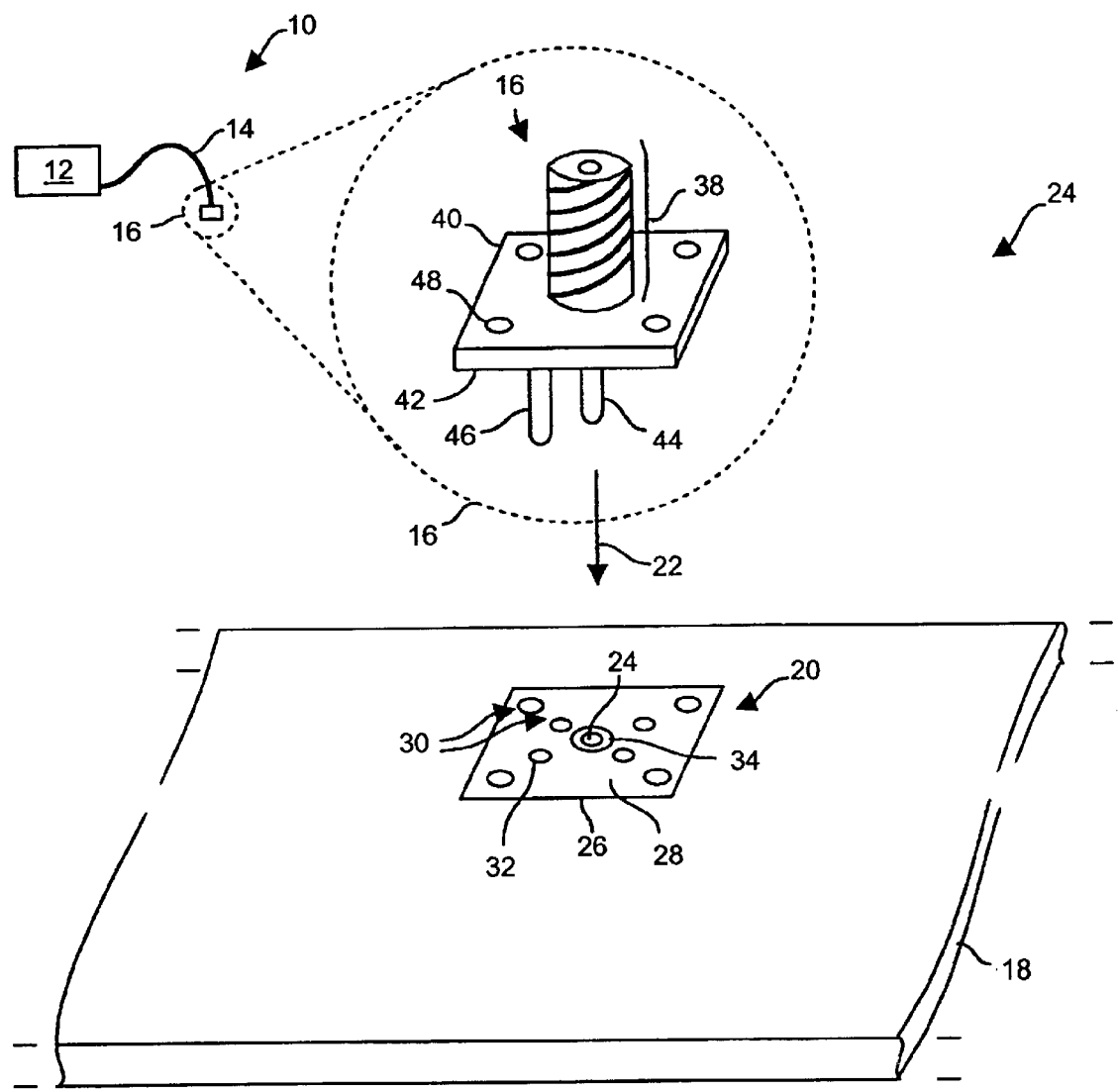
FIG. 1 is a perspective view of measurement equipment and a connection system which is suitable for use by the invention.

FIG. 1 shows measurement equipment 10 which is suitable for use by the invention. The measurement equipment 10 includes a measuring device 12 (e.g., a TDR), a cable 14 and an RF probe 16. The cable 14 connects the RF probe 16 to the measuring device 12.

The RF probe 16 is capable of connecting to a circuit board 18 (see detailed view in FIG. 1). In particular, the RF probe 16 is capable of engaging a signal launch 20 (e.g., an SMA launch) of the circuit board 18 when moved by a user (e.g., an engineer, a technician, etc.) in a direction 22 toward the circuit board 18. The RF probe 16 and the circuit board signal launch 20 form a connection system 24, i.e., a robust electrical connection that allows the measuring device 12 to sample signals from the circuit board 18.

The signal launch 20 includes a centrally-located signal conductor 24 (e.g., a signal via), and a ground conductor 26. The signal conductor 24 is a signal via (e.g., a plated-through hole) that leads to additional conductive material of the circuit board 18 (e.g., signal etch). The ground conductor 26 includes a conductive pad 28 and multiple ground vias 30 which electrically connect with additional conductive material of the circuit board 18 (e.g., one or more ground planes). Among the ground vias 30 is at least one inner ground via 32 that resides proximate the signal conductor 24. A gap or void 34 between the signal conductor 24 and the ground conductor 26 (e.g., the absence of conductive material, non-conductive material separating the signal conductor 24 from the ground conductor 26, etc.) prevents the signal conductor 24 and the ground conductor 26 from shorting together.

The RF probe 16 includes a cabling portion 38 that attaches to an end of the cable 14, a base portion 40, a signal post 44 (e.g., a pin) and a ground post 46. The base portion 40 has a flat-faced side 42 from which the signal post 44 and the ground post 46 extend. When a user moves the RF probe 16 toward the signal launch 20 (see arrow 22 in FIG. 1), the signal post 44 engages with the signal conductor 24, and the ground post 46 engages with the inner ground via 32. The user can slightly manipulate or twist the RF probe 16 such that the posts 44, 46 press against the sides of the vias 24, 32 for robust electrical contact (e.g., slightly rotate the RF probe 16).

In one arrangement, the cabling portion 38 and the base portion 40 of the RF probe 16 are formed by a permanent surface mount RF connector, namely a flat-faced surface mount connector having mounting holes 48 that align with a set of outer ground vias of the signal launch ground vias 30. In this arrangement, it should be understood that the inductance loop formed between the RF probe 16 and the signal launch 20 is smaller than the inductance loop formed between the permanent surface mount RF connector in its conventional use (i.e., with screws through the mounting holes 48 and corresponding vias 30 of the signal launch 20) because the distance between the ground post 46 and the signal post 44 is less than the distance between the mounting holes 48 and the signal post 44. This shorter distance provides a smaller inductance loop and thus makes the RF probe 16 better suited for sampling signals at higher speeds.

It should be understood that the use of the permanent surface mount RF connector as a portion of the RF probe 16 enables the circuit board 18 to be backward compatible. That is, the circuit board 18 can have a permanently mounted surface mount connector installed (e.g., soldered or screwed) onto the signal launch 20, or have the signal launch 20 exposed for use by the RF probe 16 since the cabling and base portions of the RF probe 16 have the same geometry as a permanent surface mount RF connector. Accordingly, no modifications need to be made to the circuit board 18 with the signal launch 20 when using the RF probe 16 in lieu of a permanently mounted RF connector. Further details of the RF probe 16 will now be provided with reference to FIGS. 2A and 2B.

Figure 2A:
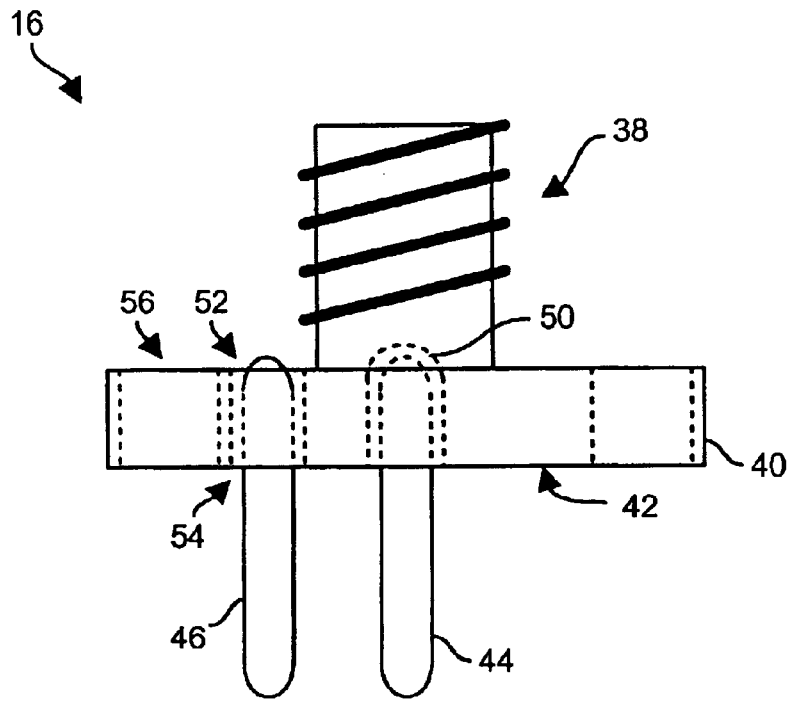
FIG. 2A is a cross-sectional side view of a radio frequency (RF) probe of the connection system of FIG. 1.

FIG. 2A shows a cross-sectional side view of the RF probe 16. As shown, the base portion 40 attaches to the cabling portion 38. The signal post 44 attaches within a signal post cavity 50 of the base portion 40 (e.g., a female connecting portion of a signal conductor) through the flat-faced side 42. Similarly, the ground post 46 attaches within a ground post cavity 52 of the base portion 40 (e.g., a drilled hole within a ground conductor of the base portion) through the flat-faced side 42. In one arrangement, the ground post 46 connects to the base portion 40 at a solder joint 54. Also shown are the cavities 56 of the mounting holes 48 (see also FIG. 1) of the base portion 40.

Figure 2B:
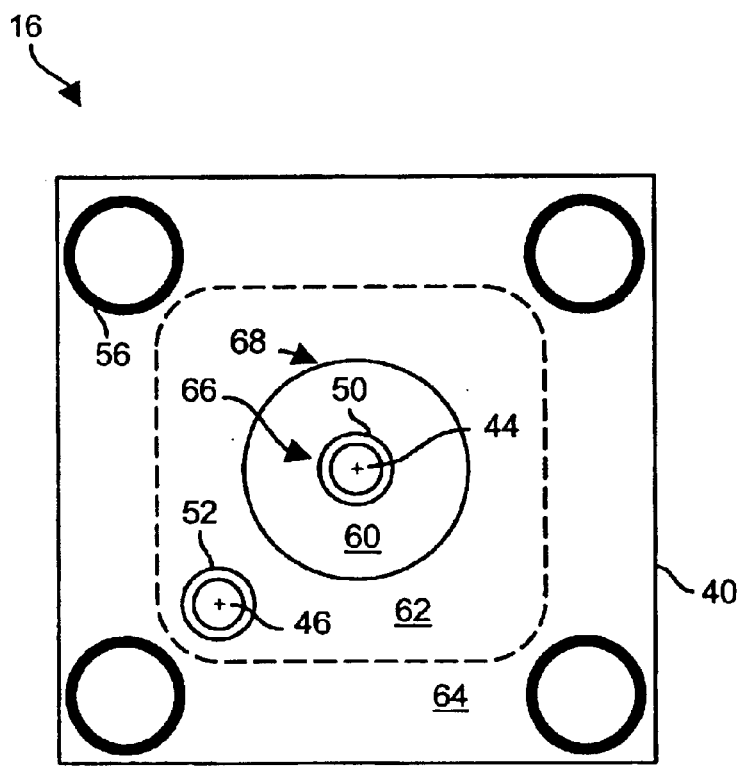
FIG. 2B is a bottom view of the RF probe of FIG. 2A.

FIG. 2B shows a bottom view of the RF probe 16. In this view, the signal post 44 and the ground post 46 appear to extend up from the flat-faced side 42 of the base portion 40 (i.e., up from the page). The flat-faced side 42 of the base portion 40 has a central region 60, a peripheral region 64 that extends along a periphery of the flat-faced side 42, and an intermediate region 62 disposed between the central region 60 and the peripheral region 64. The signal post cavity 50 resides in the central region 60 of the base portion 40, and the signal post 44 extends from the central region 60. Similarly, the ground post cavity 52 resides in the intermediate region 62 of the base portion 40, and the ground post 46 extends from the intermediate region 62. The mounting holes 56 reside in the peripheral region 64 of the base portion 40.

It should be understood that, within the central region 60 of the flat-faced side 42 of the base portion 40, there is a gap or void of conductive material. This void extends from the outer edge 66 of the signal conductor of the RF probe 16 to the inner edge 68 of the ground conductor of the RF probe 16. Accordingly, the gap and a non-conductive material within the RF probe separate the signal conductor from the ground conductor preventing an unintended short.

It should be further understood that the inductance loop formed by the RF probe 16 is smaller than that formed in conventional uses of a permanent surface mount RF connector because the distance between the ground post 46 and the signal post 44 is smaller than the distance between the mounting holes 48 (conventionally used when permanently mounting the permanent surface mount RF connector) and the signal post 44. Accordingly, there is less signal distortion when sampling high-speed signals using the RF probe 16 vis-à-vis a permanently mounted RF connector.

In one arrangement, the ground post cavity 52 is disposed between the signal post cavity 52 and a mounting hole 56, and the ground post 46 is disposed between the signal post 44 and that mounting hole 56. This arrangement is well-suited for the signal launch 20 of FIG. 1 which has inner ground vias 32 disposed between the signal via 24 and outer ground vias. The alignment of the inner and outer ground vias 30 of the signal launch 20 permits a signal conductor of the circuit board 18 to easily access the signal via 24 without having to bend sharply are twist around the ground vias 30 surrounding the signal via 24. Further details of the invention will now be provided with reference to FIG. 3.

Figure 3:
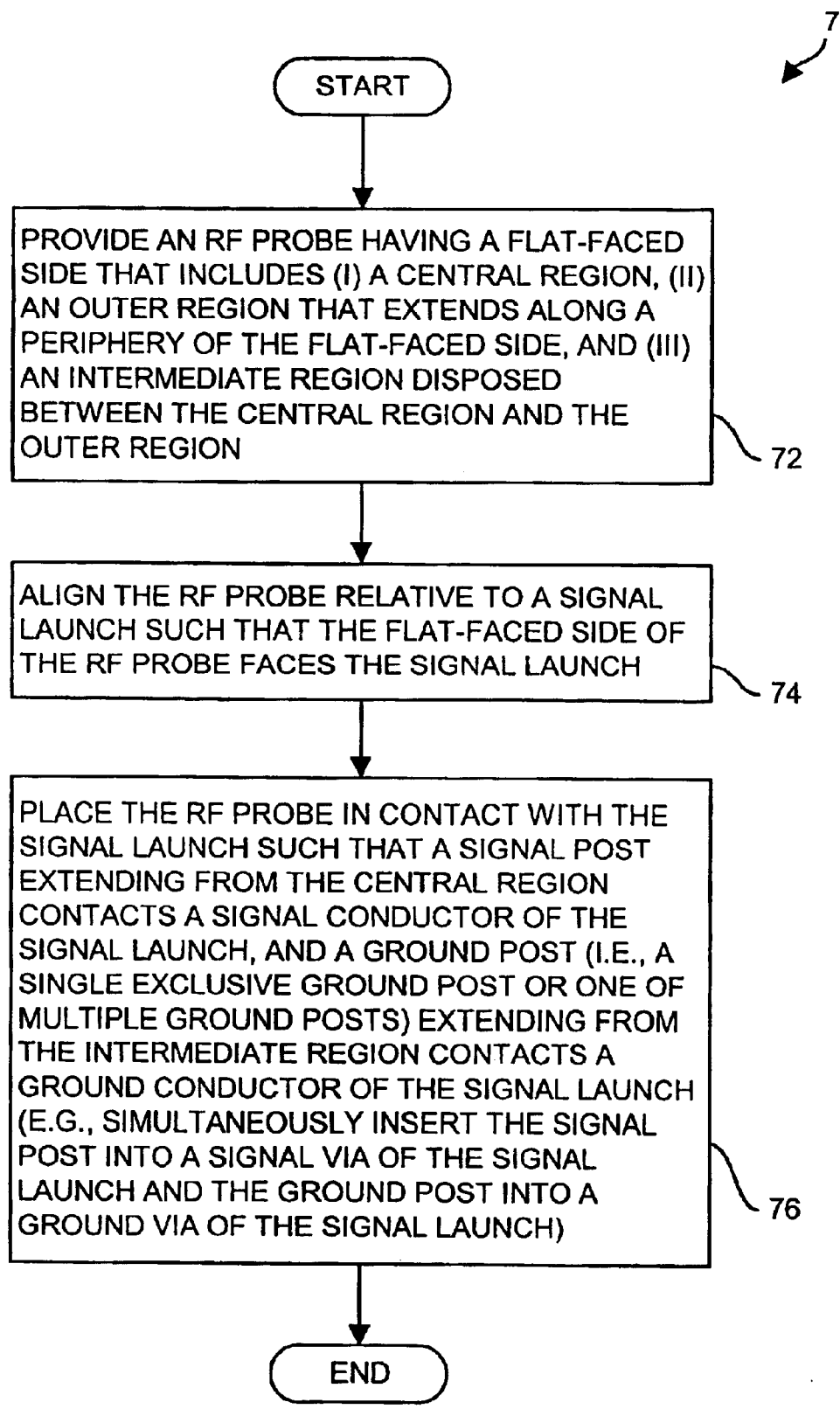
FIG. 3 is a flow chart of a procedure for using the RF probe of FIGS. 2A and 2B.

FIG. 3 is a flow chart of a procedure 70 that can be performed by a user to connect an RF probe to a signal launch. In step 72, a user provides an RF probe having a flat-faced side that includes (i) a central region, (ii) an outer region that extends along a periphery of the flat-faced side, and (iii) an intermediate region disposed between the central region and the outer region. The RF probe may already be attached to a measuring device through a cable, and the measuring device may be turned on (i.e., powered up and capable of measuring signals) to commence signal measurement as soon as the RF probe engages a signal launch.

In step 74, the user aligns the RF probe relative to a signal launch such that the flat-faced side of the RF probe faces the signal launch. Preferably, the user does not directly touch the conductive material of the RF probe to avoid signal distortion (e.g., the user handles the RF probe by holding the cable).

In step 76, the user places the RF probe in contact with the signal launch such that a signal post extending from the central region of the flat-faced side contacts a signal conductor of the signal launch, and a ground post extending from the intermediate region contacts a ground conductor of the signal launch. In one arrangement, the signal post engages a signal via of the signal launch as the ground post simultaneously engages a ground via of the signal launch.

Further details of the procedure 70 will now be provided by way of the following example which refers to the connection system 24 of FIG. 1. Suppose that a user wishes to examine particular electrical properties of a device under test (DUT) using the circuit board 18 of FIG. 1 by performing the procedure 70 of FIG. 3. The circuit board 18 can be the DUT itself, or an ancillary circuit board (e.g., a daughter card) that closely integrates with the DUT (e.g., couples through a high-density connector, a backplane, etc.).

As step 72 of the procedure 70, the user provides the RF probe 16 having a base portion 40 with a flat-faced side 42. As shown in FIG. 2B, the flat-faced side 42 includes a central region 60, an outer region 64 that extends along a periphery of the base portion 40, and an intermediate region 62 disposed between the central region 60 and the outer region 64.

As step 74, the user aligns the RF probe 16 over the signal launch 20 of the circuit board 18 such that the flat-faced side 42 of the base portion 40 faces the signal launch 20. In particular, the signal post 44 aligns with the signal via 24, and the ground post 46 align with the inner ground via 32

As step 76, the user places the RF probe 16 in contact with the signal launch 20 such that the signal post 44 extending from the central region 60 (see FIG. 2) fully engages the signal via 24 and the ground post 46 extending from the intermediate region 62 fully engages the inner ground via 32. At this point, the ground conductor portion of the flat-faced side 42 contacts the ground pad 28 of the signal launch 20. The user may press or twist the RF probe 16 slightly to provide solid contact between the posts 44, 46 and the corresponding inner surfaces of the vias 24, 32. If the measurement device 12 is in operation, the user can commence signal measurement.

It should be understood that the user can later sample a signal from another signal launch simply by removing the RF probe 16 from the first signal launch and inserting the RF probe 16 into another signal launch (repeating steps 74 and 76). No additional permanent surface mount RF connectors are needed thus keeping costs low, and no disconnecting of mounted RF connectors (e.g., unsoldering or unscrewing) is required thus minimizing the burden on the engineer. Further details of the invention will now be provided with reference to FIG. 4.

Figure 4:
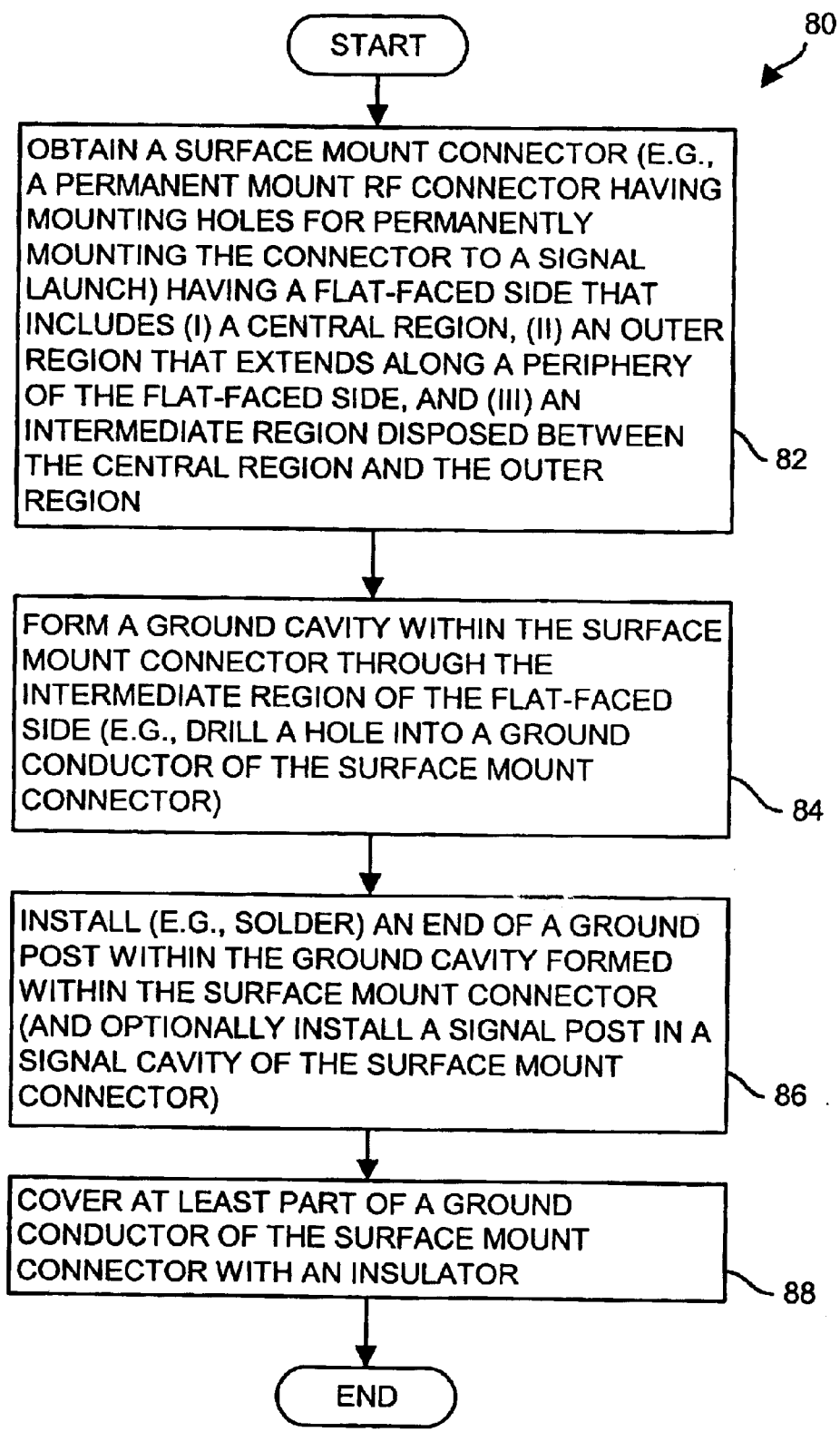
FIG. 4 is a flow chart of a procedure for making the RF probe of FIGS. 2A and 2B.

FIG. 4 is a flow chart of a procedure 80 for providing an RF probe in accordance with the invention. In step 82, a user obtains a surface mount connector having a flat-faced side that includes (i) a central region, (ii) an outer region that extends along a periphery of the flat-faced side, and (iii) an intermediate region disposed between the central region and the outer region. A conventional permanent mount RF connector is suitable for use as the surface mount connector.

In step 84, the user forms a ground post cavity within the surface mount connector through the intermediate region of the flat-faced side. By way of example only, the user can drill a hole through the flat-faced side to form the ground cavity.

In step 86, the user installs an end of a ground post within the ground cavity. The user can install a signal post to the surface mount connector at this time as well. By way of example, the user can solder the ground post to the surface mount connector at the intermediate region of the flat-faced side.

In step 88, the user covers at least part of a ground conductor of the surface mount connector with an insulator. By way of example only, the user can apply a protective covering or insulator (e.g., rubber) or coating around an outer portion of the surface mount connector to prevent the user from inadvertently contacting the ground conductor of the surface mount connector during signal sampling to avoid signal distortion.

Further details of the procedure 80 will now be provided by way of the following example which refers to the connection system 24 of FIG. 1. Suppose that a user wishes to make the RF probe 16. As step 82 of the procedure 80, the user obtains a permanent mount RF connector. The cabling portion 38 and the base portion 40 belong to such a permanent mount RF connector. An off-the-shelf component which is suitable for use as the permanent mount RF connector is Precision Microwave Component No.: 5941-4CC manufactured by Connecting Devices, Incorporated (CDI) of Long Beach, Calif.

As step 84, the user drills a hole in the base portion 40 of the surface mount connector to form the ground post cavity (see the ground post cavity 52 of FIGS. 2A and 2B). In one arrangement, the user drills the hole between the signal post cavity 50 (preferably pre-installed in the surface mount connector) and one of the mounting holes 56 (also preferably pre-formed in the permanent mount RF connector).

As step 86, the user solders the ground post 46 to the base portion 40 of the surface mount connector. In one arrangement, the diameter of the ground post cavity 52 is such that solder can flow between the ground post 46 and the ground conductor of the base portion 40 to form a healthy solder joint that holds the ground post 46 firmly in place and provides robust electrical contact between the ground post 46 and the ground conductor. In another arrangement, the diameter of the ground post cavity 52 substantially equals the diameter of the ground post 46 for a zero-tolerance fit. In yet another arrangement, the diameter of the ground post cavity 52 is slightly smaller than the diameter of the ground post 46 for a tight press-fit.

Also, at this time, the user can install the signal post 44 in the signal post cavity 50 of the permanent mount RF connector. In one arrangement, the user can solder the signal post 44 to the signal conductor to prevent removal of the signal post 44. In another arrangement, the user simply press-fits the signal post into the signal cavity 50.

As step 88, the user covers at least part of the ground conductor of the base portion 40 with an insulator. In one arrangement, the user coats the ground conductor with the insulator (e.g., rubber). In another arrangement, the user places an insulating sleeve around the ground conductor.

As described above, the invention is directed to techniques for connecting to a signal launch using an RF probe 16 having a flat-faced side 42 with a ground post 46 extending from a non-peripheral region (e.g., an intermediate region 62 between a central region 60 and a peripheral region 64 of the flat-faced side 42). The use of the RF probe 16 alleviates the need to use many RF connectors permanently mounted to signal launches on a circuit board (and thus reduces cost) since the RF probe 16 can be temporarily connected to the signal launches without such connectors. Furthermore, the ground post 46 can be configured to avoid large inductance loops thus preserving signal integrity. The techniques of the invention may be used for sampling signals in a high-speed digital system, a high-frequency RF or microwave system, or in other computer-related systems and methods, such as those of Teradyne Corporation of Boston, Mass.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the RF probe 16 of the measuring equipment 10 of FIG. 1 was shown as including a single ground post 46 by way of example only. In another arrangement, the measuring equipment 10 includes an RF probe having multiple ground posts, as shown in FIGS. 5A and 5B.

Figure 5A:
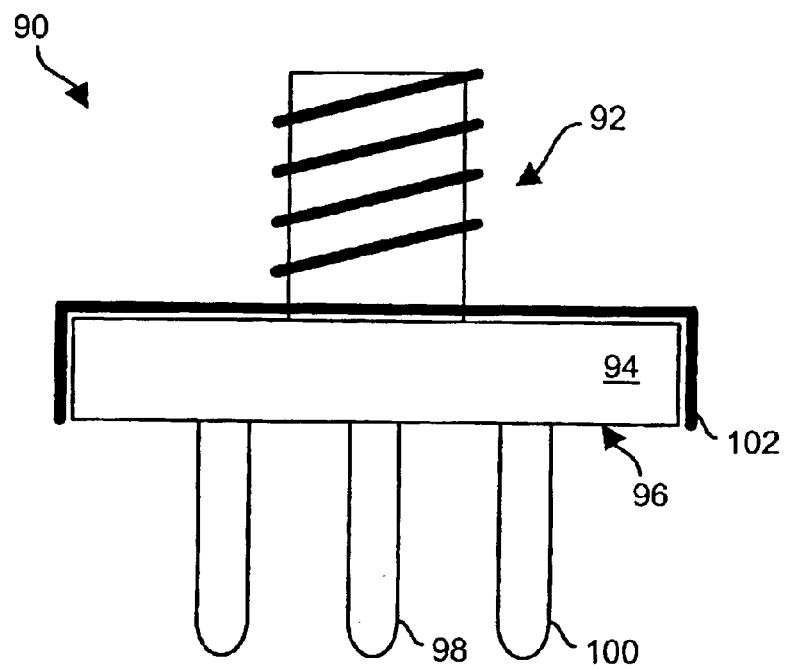
FIG. 5A is a cross-sectional side view of an alternative RF probe which is suitable for use by the connection system of FIG. 1.

FIG. 5A shows a cross-sectional side view of an alternative RF probe 90 having a cabling portion 92, a base portion 94 having a flat-faced side 96, a signal post 98 and four ground posts 100. The RF probe 90 further includes an insulator 102 that covers an exterior surface of the base portion 94. The signal post 98 and the ground posts 100 attach to the base portion 94 in manners similar to that explained above for the RF probe 16 of FIGS. 2A and 2B.

Figure 5B:
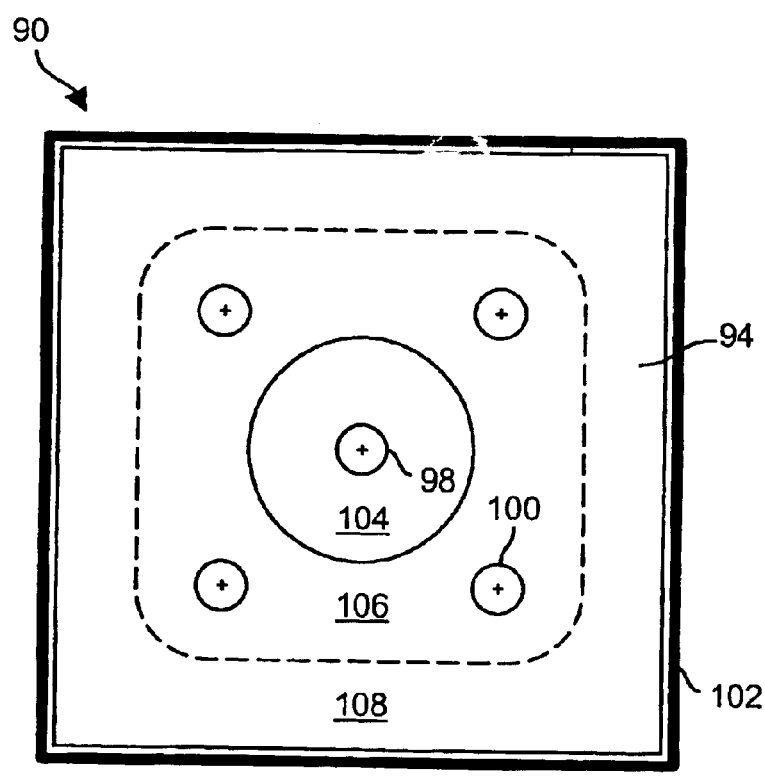
FIG. 5B is a bottom view of the alternative RF probe of FIG. 5A.

FIG. 5B shows a bottom view of the RF probe 90. In this view, the signal post 98 and the ground posts 100 appear to extend up from the flat-faced side 96 of the base portion 94 (i.e., up from the page). The flat-faced side 96 of the base portion 94 has a central region 104, a peripheral region 108 that extends along a periphery of the flat-faced side 96, and an intermediate region 106 disposed between the central region 104 and the peripheral region 108.

When the RF probe 90 is in use, a cable leading to a measuring device (see the cable 14 leading to the measuring device 12 of FIG. 1) attaches to the cabling portion 92. A user then holds the RF probe 90 and the cable while sampling signals from a circuit board (see the circuit board signal launch 20 of FIG. 1). The insulator 94 prevents the user from inadvertently touching conductive material of the base portion 94 (e.g., the ground conductor) during testing. The ground posts 100 provide evenly distributed return pathways for ground current during testing. Furthermore, the ground posts 100 enable the user to easily align the RF probe 90 with the signal launch, and to maintain pressure between the RF probe 90 and the signal launch in order to form a robust electrical connection.

Additionally, it should be understood that the mounting holes 48 of the RF probe 16 (see FIG. 1) were included by way of example only since it was explained that a standard permanent surface mount RF connector was suitable for use as the cabling and base portions of the RF probe 16. However, it should be understood that the mounting holes 48 are not required. For example, the RF probe 90 is shown without mounting holes extending from the peripheral region 108.

Furthermore, it should be understood that the ground post cavity 52 was shown as extending all the way through the base portion 40 by way of example only (see FIG. 2A). This allows solder to percolate through the cavity 52 during the soldering process to form a robust solder joint. In other arrangements, the ground post cavity 52 does not extend all the way through the cavity 52. Rather, the ground post cavity 52 extends only partially into the base portion 40 preventing the ground post 46 from pushing through the base portion 40.

Additionally, it should be understood that the procedures of FIGS. 3 and 4 can be modified. For example, in the procedure 80 of FIG. 4, it should be understood that step 88, which involves covering the ground conductor of the RF probe with an insulator, is optional. Also, certain steps can be performed in different orders. For example, step 88 of the procedure 80 can be performed ahead of step 86 rather than afterward. Other modifications can be made to the procedures and are intended to be within the scope of the invention.

What is claimed is:

1. A method for connecting a radio frequency probe to a signal launch, the method comprising the steps of:

providing a radio frequency probe having a flat-faced side that includes (i) a central region, (ii) an outer region that extends along a periphery of the flat-faced side, and (iii) an intermediate region disposed between the central region and the outer region;

aligning the radio frequency probe relative to the signal launch such that the flat-faced side of the radio frequency probe faces the signal launch; and placing the radio frequency probe in contact with the signal launch such that a signal post extending from the central region of the flat-faced side of the radio frequency probe contacts a signal conductor of the signal launch, and a ground post extending from the intermediate region of the flat-faced side of the radio frequency probe contacts a ground conductor of the signal launch.

2. The method of claim 1 wherein the signal launch includes a signal via, outer ground vias, and an inner ground via that is disposed between the signal via and one of the outer ground vias; and wherein the step of placing includes the step of:

inserting the ground post into the inner ground via.

3. The method of claim 1 wherein the signal launch includes a signal via, outer ground vias, and an inner ground via that is disposed between the signal via and one of the outer ground vias; and wherein the step of placing includes the step of:

simultaneously inserting the signal post into the signal via, and the ground post into the inner ground via that is disposed between the signal via and one of the outer ground vias of the signal launch.

4. The method of claim 1 wherein the ground post extending from the intermediate region of the flat-faced side of the radio frequency probe is a single exclusive ground post for the radio frequency probe, and wherein the step of placing includes the step of:

engaging the single exclusive ground post within a ground via of the signal launch.

5. The method of claim 1 wherein the radio frequency probe includes multiple ground posts extending from the intermediate region, and wherein the step of placing includes the step of:

engaging each of the multiple ground posts of the radio frequency probe within a corresponding ground via of the signal launch.

6. The method of claim 1 wherein M and N are positive integers, wherein N is less than M, wherein the ground conductor of the signal launch includes M ground vias, wherein the radio frequency probe includes N ground posts extending from the intermediate region, and wherein the step of placing includes the step of:

engaging the N ground posts of the radio frequency probe into N ground vias of the M ground vias.

7. The method of claim 6 and wherein M equals eight and N equals one.

8. A method for providing a radio frequency probe, the method comprising the steps of:

obtaining a surface mount connector having a flat-faced side that includes (i) a central region, (ii) an outer region that extends along a periphery of the flat-faced side, and (iii) an intermediate region disposed between the central region and the outer region;

forming a cavity within the surface mount connector through the intermediate region of the flat-faced side of the surface mount connector; and installing an end of a ground post within the cavity formed within the surface mount connector.

9. The method of claim 8 wherein the step of obtaining includes the step of:

acquiring, as the surface mount connector, a permanent mount radio frequency connector having a base portion that defines mounting holes for permanently mounting the surface mount connector to a signal launch.

10. The method of claim 8 wherein the intermediate region and the outer region form a ground conductor of the surface mount connector, and wherein the method further comprises the step of:

covering at least part of the ground conductor of the surface mount connector with an insulator.

11. The method of claim 8 wherein the surface mount connector includes a ground conductor that defines the flat-faced side of the surface mount connector; wherein the step of forming the cavity includes the step of:

drilling a hole into the ground conductor of the surface mount connector through the intermediate region of the flat-faced side; and wherein the step of installing the end of the ground post includes the step of:

soldering the ground post to the drilled hole of the ground conductor to form a solder joint between the ground post and the ground conductor.

12. The method of claim 8 wherein the central region includes a conductive signal portion and a non-conductive portion, wherein the intermediate region includes a conductive ground portion which is electrically isolated from the conductive signal portion of the central region by the non-conductive portion of the central region, and wherein the step of installing includes the step of:

electrically connecting the ground post to the conductive ground portion of the intermediate region.

13. The method of claim 12, further comprising the step of:

electrically connecting a signal post to the conductive signal portion of the central region, the signal post extending along a central axis of the surface mount connector and in a direction substantially parallel to the ground post.

14. The method of claim 8 wherein the step of installing includes the step of:

inserting the ground post into the cavity in a direction that is substantially perpendicular to the flat-faced side of the surface mount connector to enable the ground post to engage a via of a circuit board when the flat-faced side of the surface mount connector makes flush contact with the circuit board.

15. A method for connecting a radio frequency probe to a signal launch, the method comprising the steps of:

providing a radio frequency probe having a flat-faced side that includes (i) a central region, (ii) a conductive outer region that extends along a periphery of the flat-faced side, and (iii) a conductive intermediate region disposed between the central region and the conductive outer region, the conductive outer region and the conductive intermediate region being electrically connected with each other;

aligning the radio frequency probe relative to the signal launch such that the flat-faced side of the radio frequency probe faces the signal launch; and placing the radio frequency probe in contact with the signal launch such that a signal post extending from the central region of the flat-faced side of the radio frequency probe contacts a signal conductor of the signal launch, and a ground post extending from the conductive intermediate region of the flat-faced side of the radio frequency probe contacts a ground conductor of the signal launch.

16. A method for providing a radio frequency probe, the method comprising the steps of:

obtaining a surface mount connector having a flat-faced side that includes (i) a central region having a conductive portion and a non-conductive portion, (ii) a conductive outer region that extends along a periphery of the flat-faced side, and (iii) a conductive intermediate region disposed between the central region and the conductive outer region, the conductive outer region and the conductive intermediate region being electrically connected with each other, the non-conductive portion of the central region electrically isolating the conductive intermediate region from the conductive portion of the central region;

forming a cavity within the surface mount connector through the conductive intermediate region of the flat-faced side of the surface mount connector; and installing an end of a ground post within the cavity formed within the surface mount connector.

17. The method of claim 16, further comprising the step of:

electrically connecting a signal post to the conductive portion of the central region, the signal post extending along a central axis of the surface mount connector and in a direction substantially parallel to the ground post.

18. The method of claim 16 wherein the step of installing includes the step of:

inserting the ground post into the cavity in a direction that is substantially perpendicular to the flat-faced side of the surface mount connector to enable the ground post to engage a via of a circuit board when the flat-faced side of the surface mount connector makes flush contact with the circuit board.

* * * * *